(12) United States Patent
Chang et al.

(10) Patent No.: US 10,727,383 B2
(45) Date of Patent: Jul. 28, 2020

(54) LED PACKAGE STRUCTURE

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: Yu-Yu Chang, Kaohsiung (TW); Shih-Chiang Yen, Taipei (TW); Yi-Hsuan Chen, New Taipei (TW); Chen-Hsiu Lin, New Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/819,599

(22) Filed: Nov. 21, 2017

(65) Prior Publication Data
US 2018/0190884 A1 Jul. 5, 2018

(30) Foreign Application Priority Data
Dec. 30, 2016 (CN) .......................... 2016 1 1259007

(51) Int. Cl.
*H01L 33/58* (2010.01)
*H01L 33/48* (2010.01)
(Continued)

(52) U.S. Cl.
CPC ............ *H01L 33/58* (2013.01); *H01L 33/486* (2013.01); *H01L 33/502* (2013.01); *H01L 33/505* (2013.01); *H01L 33/62* (2013.01); *H01L 25/0753* (2013.01); *H01L 25/167* (2013.01); *H01L 29/866* (2013.01); *H01L 33/60* (2013.01)

(58) Field of Classification Search
CPC .............................. H01L 33/502; H01L 33/58
See application file for complete search history.

(56) References Cited

U.S. PATENT DOCUMENTS

2007/0278512 A1* 12/2007 Loh ..................... B29C 45/1671
257/99
2012/0205699 A1* 8/2012 Yoo ....................... H01L 25/167
257/98
(Continued)

*Primary Examiner* — Matthew C Landau
*Assistant Examiner* — Mark Hatzilambrou
(74) *Attorney, Agent, or Firm* — Li & Cai Intellectual Property (USA) Office

(57) ABSTRACT

An LED package structure includes a substrate, an electrode layer and an insulating layer in a coplanar arrangement and disposed on the substrate, an LED chip mounted on the electrode layer and the insulating layer, a phosphor sheet covering entirely a top surface of the LED chip, a first translucent layer disposed on a light emitting surface of the phosphor sheet, and a reflective housing covering the side surfaces of the LED chip and the side surfaces of the phosphor sheet. The light emitting surface has a central region and a ring-shaped region surrounding the central region. The first translucent layer covers at least 60% of an area of the ring-shaped region. A refractive index of the first translucent layer is larger than one and is smaller than that of the phosphor sheet. A top surface of the reflective housing is substantially flush with the light emitting surface.

12 Claims, 19 Drawing Sheets

(51) Int. Cl.
*H01L 33/50* (2010.01)
*H01L 33/62* (2010.01)
*H01L 25/075* (2006.01)
*H01L 33/60* (2010.01)
H01L 25/16 (2006.01)
H01L 29/866 (2006.01)

(56) References Cited

U.S. PATENT DOCUMENTS

2015/0263239 A1* 9/2015 Watanabe ............... F21V 13/14
362/293
2015/0311414 A1* 10/2015 Lin ....................... H01L 33/005
257/88

* cited by examiner

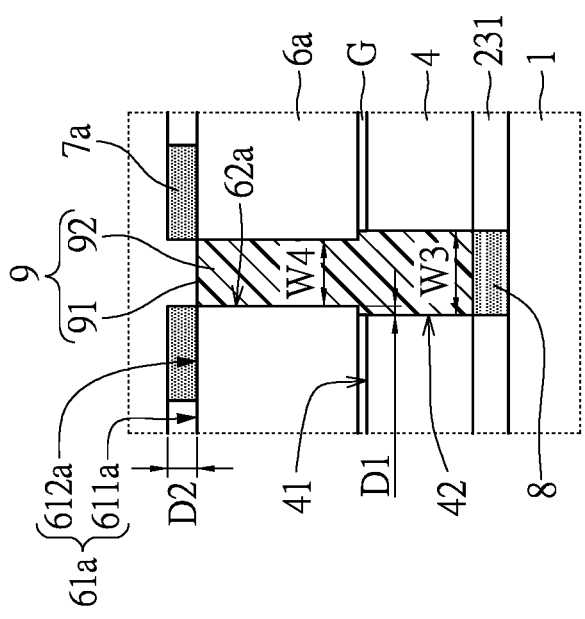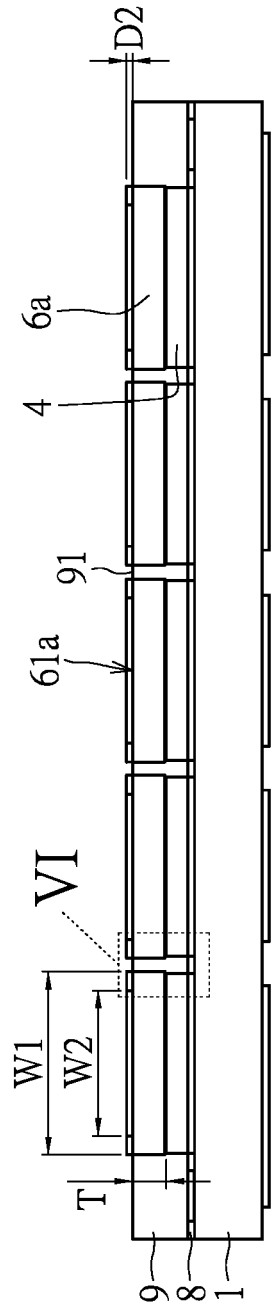

LED PACKAGE STRUCTURE

BACKGROUND OF THE INVENTION

1. Field of the Invention

The present disclosure relates to an LED; in particular, to an LED package structure.

2. Description of Related Art

A conventional LED package structure includes an LED chip and a phosphor sheet disposed on the LED chip. The phenomenon of the yellow ring is usually appeared as the light emitted from the LED chip and passing through a center region of the phosphor sheet and a side region of the phosphor sheet. Specifically, the blue light emitted from the LED chip and passing through the side region of the phosphor sheet has a large incident angle with respect to the light emitting surface of the phosphor sheet. Furthermore, the difference of refractive index between the phosphor sheet and air is large, thereby resulting in the blue light being totally reflected from the light emitting surface of the phosphor sheet and causing the yellow ring problem.

SUMMARY OF THE INVENTION

The present disclosure provides an LED package structure to solve the problem associated with conventional LED package structures.

In the present disclosure, the LED package structure adapts the first translucent layer, which has a refractive index larger than one and smaller than the refractive index of the phosphor sheet, to be disposed on the ring-shaped region of the phosphor sheet, so that the total reflection occurred on the ring-shaped region can be reduced, thereby effectively improving the yellow ring problem for the LED package structure in the present disclosure. In addition, the color uniformity of the LED package structure can be improved by using the auxiliary phosphor sheet to cooperate with the phosphor sheet.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

BRIEF DESCRIPTION OF THE DRAWINGS

FIG. 5 is a cross-sectional view taken along a cross-sectional line V-V of FIG. 1;

FIG. 6 is an enlarged view showing a portion VI of FIG. 5;

DETAILED DESCRIPTION OF THE PREFERRED EMBODIMENTS

References are hereunder made to the detailed descriptions and appended drawings in connection with the present disclosure. However, the appended drawings are merely provided for exemplary purposes, and should not be construed as restricting the scope of the present disclosure.

First Embodiment

Figure 1:
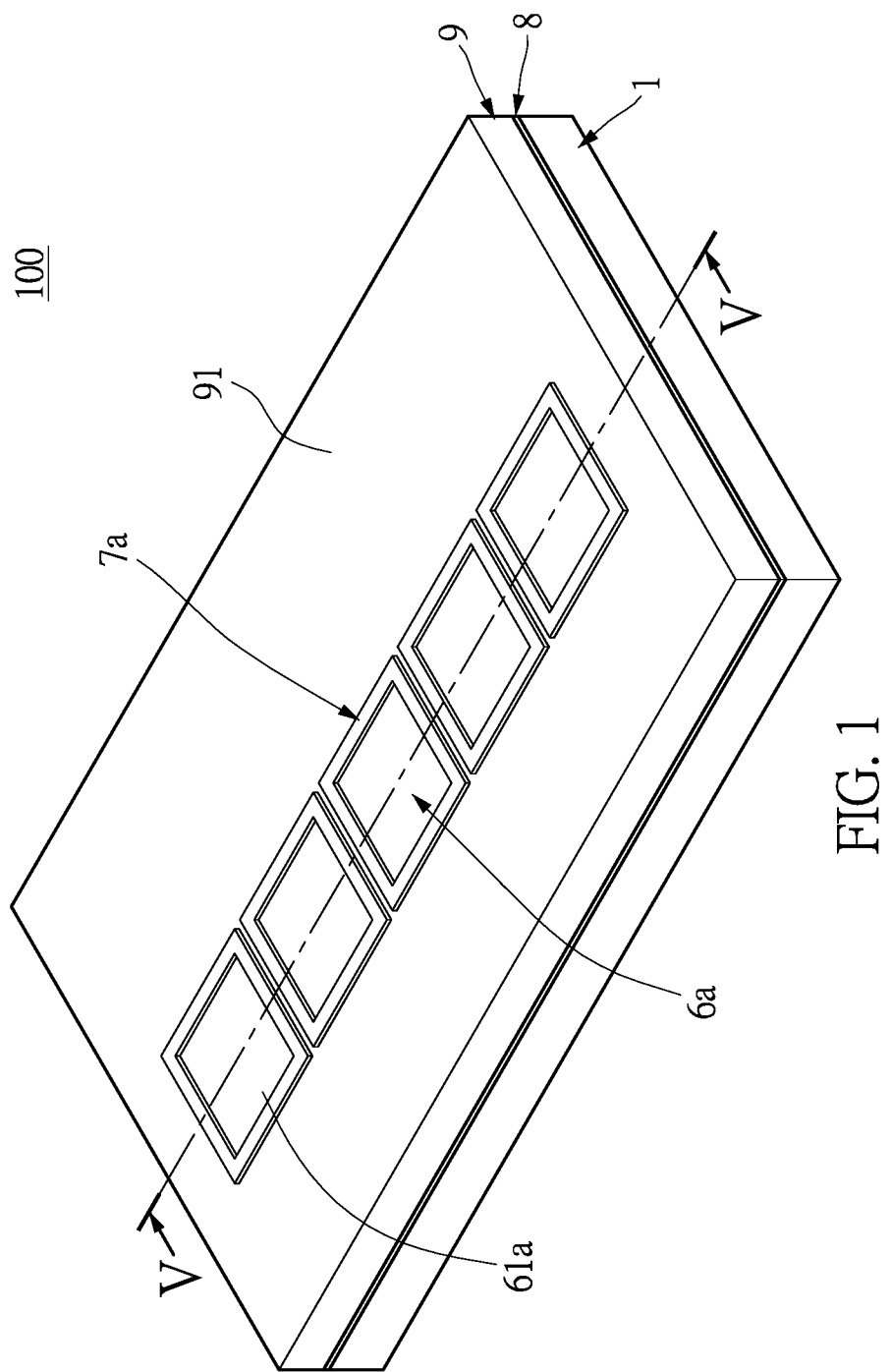
FIG. 1 is a perspective view showing an LED package structure according to a first embodiment of the present disclosure.
Figure 2:
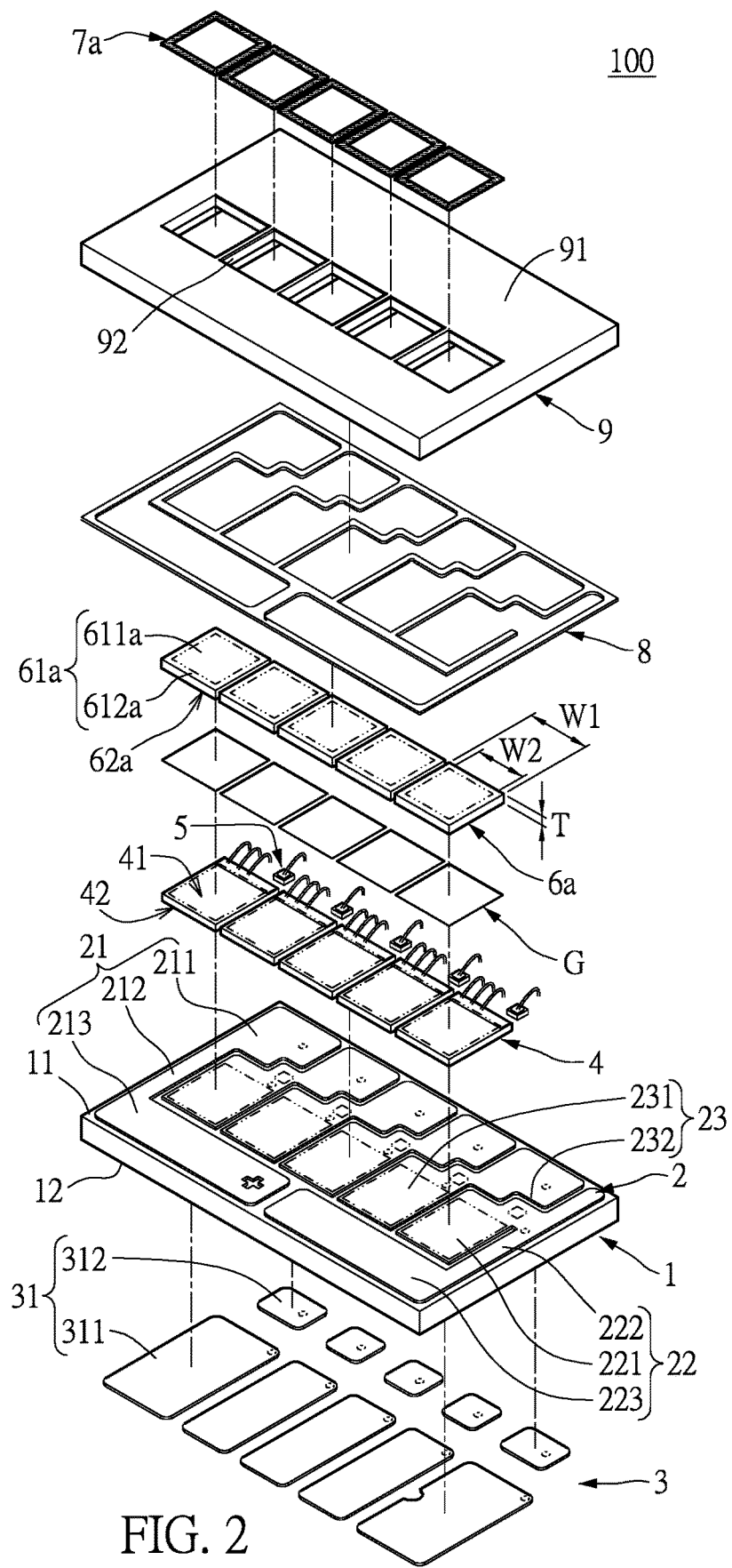
FIG. 2 is an exploded view of FIG. 1.
Figure 3:
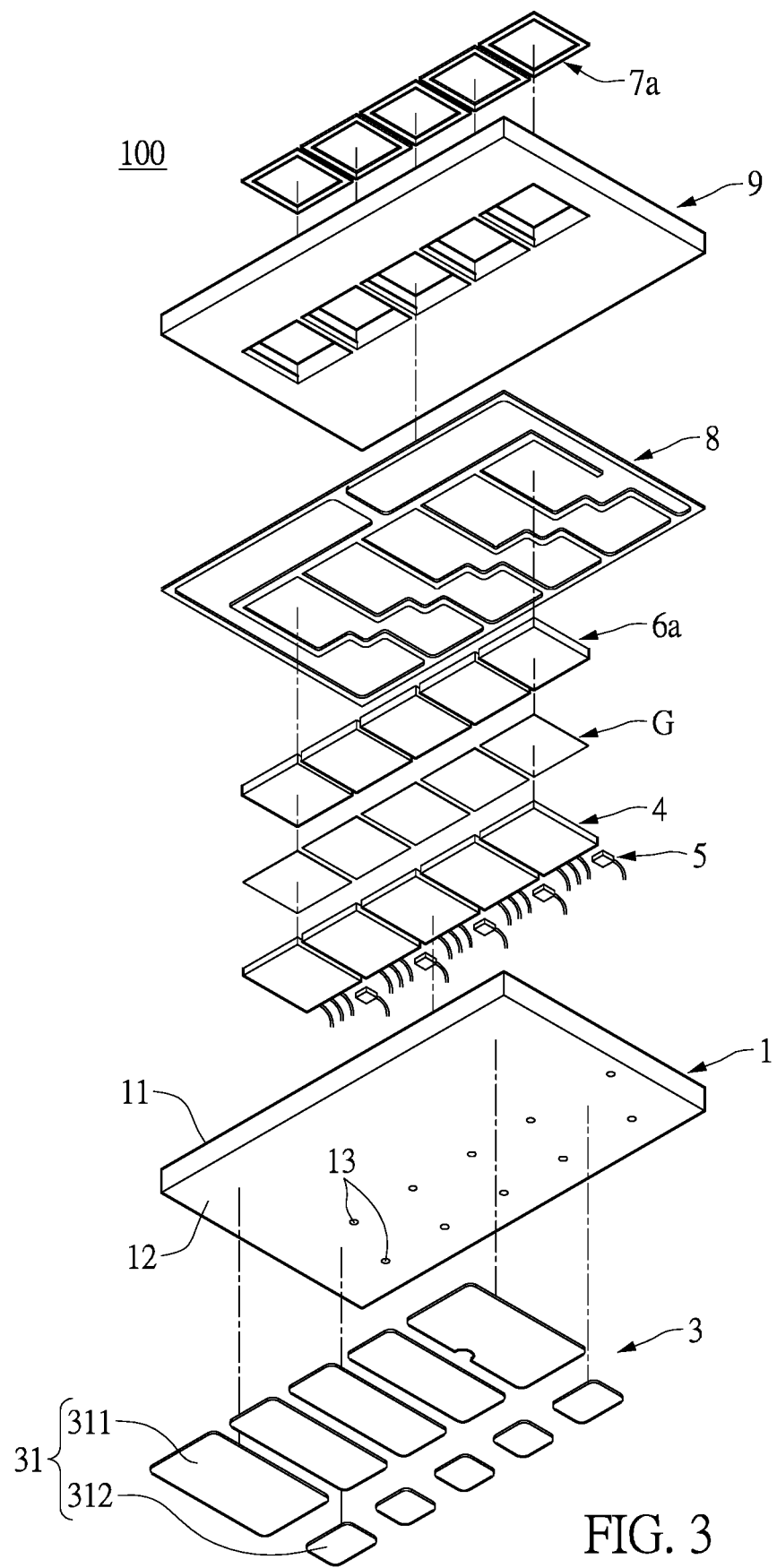
FIG. 3 is an exploded view of FIG. 1 from another perspective.

Reference is made to FIGS. 1 to 7, which illustrate a first embodiment of the present disclosure. As shown in FIGS. 1 to 3, the present embodiment discloses an LED package structure 100. The LED package structure 100 includes a substrate 1, an electrode layer 2, an insulating layer 8, a soldering layer 3, a plurality of LED chips 4, a plurality of Zener chips 5, a plurality of phosphor sheets 6a, a plurality of first translucent layers 7a each having a ring shape, and a reflective housing 9. The electrode layer 2 and the insulating layer 8 are disposed on one surface of the substrate 1, and the soldering layer 3 is disposed on the other surface of the substrate 1. The LED chips 4 and the Zener chips 5 are mounted on the electrode layer 2 and the insulating layer 8. The phosphor sheets 6a respectively cover the LED chips 4. The first translucent layers 7a are respectively disposed on the phosphor sheets 6a. The reflective housing 9 is disposed on the electrode layer 2 and the insulating layer 8, and the reflective housing 9 covers the side surfaces 42 of each LED chip 4 and the side surfaces 62a of each phosphor sheet 6a.

As shown in FIGS. 2 and 3, the substrate 1 has a first surface 11 and a second surface 12 opposite to the first surface 11. The substrate 1 includes a plurality of conductive pillars 13 embedded therein, and two opposite ends of each conductive pillar 13 are respectively exposed from the first surface 11 and the second surface 12.

Figure 4:
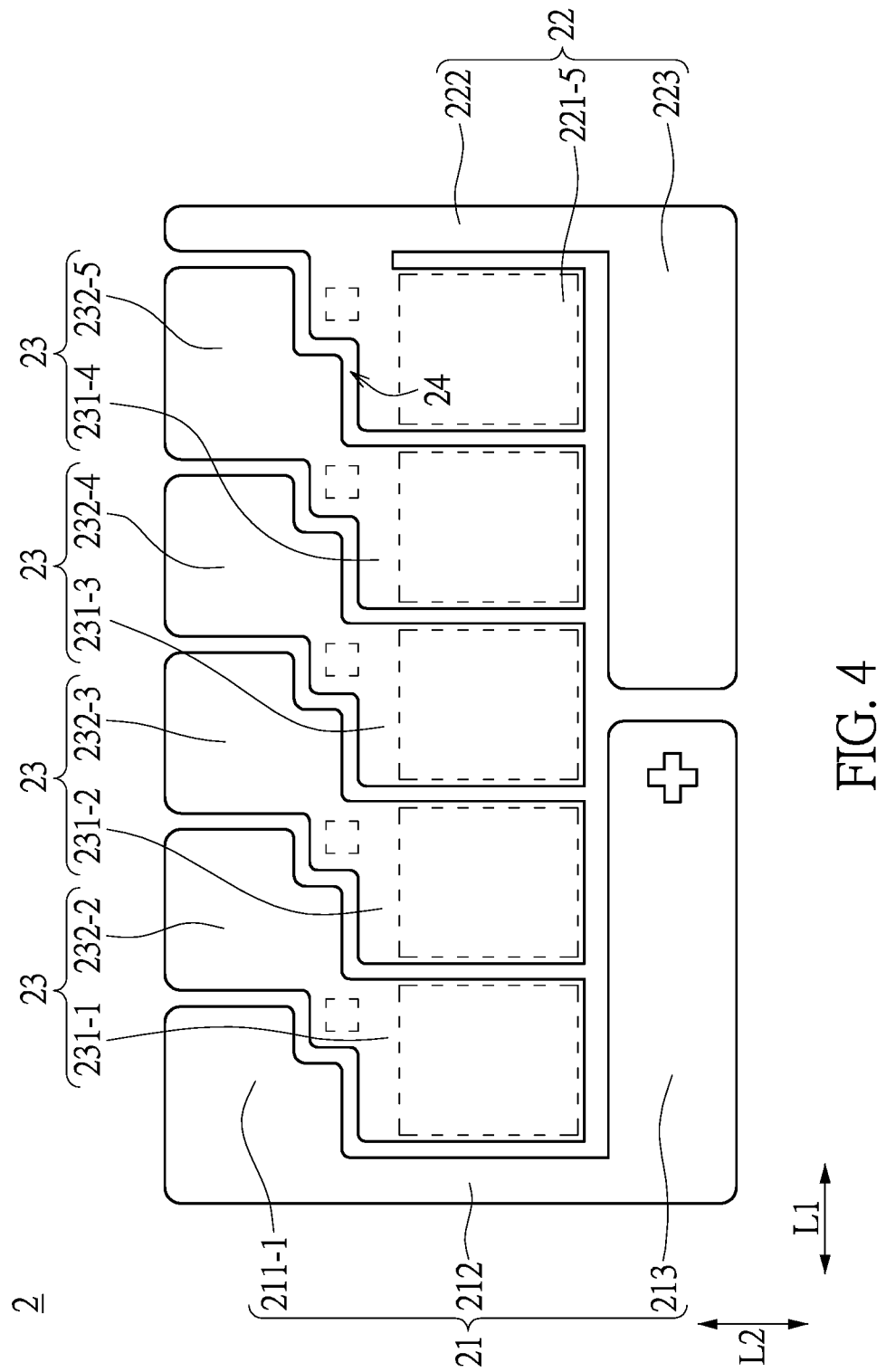
FIG. 4 is a planar view showing an electrode layer of the LED package structure.

As shown in FIGS. 2 and 4, the electrode layer 2 is disposed on the first surface 11 of the substrate 1. The electrode layer 2 includes a first metallic pad 21, a second metallic pad 22, and four third metallic pads 23. The four third metallic pads 23 are arranged between the first metallic pad 21 and the second metallic pad 22 in a first direction L1.

The first metallic pad 21 has an L-shaped first wiring portion 211-1, which can also be referred to as a wiring portion 211, an elongated first extending portion 212, and a rectangular first electrode portion 213. Two opposite ends of the first extending portion 212 are respectively connected to the first wiring portion 211-1 and the first electrode portion 213. The second metallic pad 22 has an L-shaped fifth bonding portion 221-5, which can be taken as a bonding portion 221, an elongated second extending portion 222, and a rectangular second electrode portion 223. The second extending portion 222 is connected to the fifth bonding portion 221-5 and the second electrode portion 223. Each of the third metallic pads 23 has an L-shaped bonding portion 231 (i.e., a first bonding portion 231-1, a second bonding portion 231-2, a third bonding portion 231-3, or a fourth bonding portion 231-4) and an L-shaped wiring portion 232 (i.e., a second wiring portion 232-2, a third wiring portion 232-3, a fourth wiring portion 232-4, or a fifth wiring portion 232-5) integrally connected to the bonding portion 231. Each of the bonding portion 221-5, 231-1~231-4 is provided for mounting one of the LED chips 4 and one of the Zener chips 5. Each of the wiring portion 221-1, 232-2~232-5 is provided for one of the LED chips 4 and one of the Zener chips 5 to be wired.

Moreover, the first wiring portion 211-1 of the first metallic pad 21 and the second to fifth wiring portions 232-2~232-5 of the third metallic pads 23 are arranged in one row parallel to the first direction L1 and spaced apart from each other. The fifth bonding portion 221-5 of the second metallic pad 22 and the first to fourth bonding portions 231-1~231-4 of the third metallic pads 23 are arranged in another row parallel to the first direction L1 and spaced apart from each other. The bonding portions 231-1~231-4, 221-5 and the wiring portions 211-1, 232-2~232-5 are in a staggered arrangement.

In other words, the wiring portion 211 of the first metallic pad 21 in the present embodiment can be defined as the first wiring portion 211-1, and the other wiring portions 232 of the third metallic pads 23 in the present embodiment can be sequentially defined as the second wiring portion 232-2 arranged adjacent to the first wiring portion 211-1, the third wiring portion 232-3, the fourth wiring portion 232-4, and the fifth wiring portion 232-5. Moreover, one of the bonding portions 231 of the third metallic pad 23 in the present embodiment, which is arranged distant from the bonding portion 221 of the second metallic pad 22, can be defined as the first bonding portion 231-1, and the other bonding portions 231, 221 in the present embodiment can be sequentially defined as the second bonding portion 231-2, the third bonding portion 231-3, the fourth bonding portion 231-4, and the fifth bonding portion 221-5.

The first wiring portion 211-1 and the first bonding portion 231-1 are arranged in a second direction L2 perpendicular to the first direction L1, and a gap 24 having at least one corner is formed between the first wiring portion 211-1 and the first bonding portion 231-1. The second wiring portion 232-2 and the second bonding portion 231-2 are arranged in the second direction L2, and a gap 24 having at least one corner is formed between the second wiring portion 232-2 and the second bonding portion 231-2. The third wiring portion 232-3 and the third bonding portion 231-3 are arranged in the second direction L2, and a gap 24 having at least one corner is formed between the third wiring portion 232-3 and the third bonding portion 231-3. The fourth wiring portion 232-4 and the fourth bonding portion 231-4 are arranged in the second direction L2, and a gap 24 having at least one corner is formed between the fourth wiring portion 232-4 and the fourth bonding portion 231-4. The fifth wiring portion 232-5 and the fifth bonding portion 221-5 are arranged in the second direction L2, and a gap 24 having at least one corner is formed between the fifth wiring portion 232-5 and the fifth bonding portion 221-5. Specifically, each of the gaps 24 in the present embodiment has a W shape, but the present disclosure is not limited thereto.

The five LED chips 4 are respectively mounted on the first bonding portion 231-1, the second bonding portion 231-2, the third bonding portion 231-3, the fourth bonding portion 231-4, and the fifth bonding portion 221-5, and the five LED chips 4 are respectively and electrically connected to the first wiring portion 211-1, the second wiring portion 232-2, the third wiring portion 232-3, the fourth wiring portion 232-4, and the fifth wiring portion 232-5 by wiring. Moreover, the five Zener chips 5 are respectively mounted on the first bonding portion 231-1, the second bonding portion 231-2, the third bonding portion 231-3, the fourth bonding portion 231-4, and the fifth bonding portion 221-5, and the five Zener chips 5 are respectively and electrically connected to the first wiring portion 211-1, the second wiring portion 232-2, the third wiring portion 232-3, the fourth wiring portion 232-4, and the fifth wiring portion 232-5 by wiring.

It should be noted that each of the bonding portions 221, 231 or each of the wiring portions 211, 232 in the present embodiment can be regarded as a functional portion 221, 231, 211, 232. That is to say, the functional portions 221, 231, 211, 232 in the present embodiment are a plurality of bonding portions 221, 231 for respectively mounting the LED chips 4 and a plurality of wiring portions 211, 232 for respectively wiring the LED chips 4. In addition, the number of the third metallic pads 23 of the electrode layer 2 can be adjusted according to the number of the LED chips 4. For example, if the LED package structure 100 is provided with only one LED chip 4, the electrode layer 2 is provided without any third metallic pad 23. Specifically, the electrode layer 2 includes the first metallic pad 21 and the second metallic pad 22 arranged adjacent to the first metallic pad 21.

As shown in FIG. 2, the insulating layer 8 is disposed on the first surface 11 of the substrate 1. The insulating layer 8 is shape-complementary to and coplanar with the electrode layer 2. That is to say, the insulating layer 8 is disposed on a portion of the first surface 11 of the substrate 1 which is not connected to the electrode layer 2, and a side edge of the insulating layer 8 is flush with a side edge of the substrate 1.

The soldering layer 3 is disposed on the second surface 12 and is electrically connected to the electrode layer 2 and the LED chips 4. The soldering layer 3 includes a plurality of sets of soldering pads 31. The sets of the soldering pads 31 are respectively and electrically connected to the bonding portions 231, 221 and the wiring portions 211, 232 of the electrode layer 2 by using the conductive pillars 13 embedded in the substrate 1.

Specifically, each set of the soldering pads 31 includes a negative soldering pad 311 and a positive soldering pad 312. The negative soldering pads 311 of the soldering layer 3 are respectively arranged under the bonding portions 231, 221, and are respectively and electrically connected to the bonding portions 231, 221 by using the conductive pillars 13. The positive soldering pads 312 of the soldering layer 3 are respectively arranged under the wiring portions 211, 232, and are respectively and electrically connected to the wiring portions 211, 232 by using the conductive pillars 13.

Thus, the LED chips 4 can be electrically connected in series by the arrangement of the electrode layer 2. Each set of the soldering pads 31 of the soldering layer 3 is provided in an electrically independent arrangement, so that the corresponding LED chip 4 can be controlled independently through each set of the soldering pads 31. That is to say, each LED chip 4 can be independently controlled by using the corresponding set of the soldering pads 31 for being applied to an adaptive front lighting system (AFS).

Each LED chip 4 in the present embodiment is a vertical chip. The LED chips 4 are respectively mounted on the bonding portions 221, 231 of the electrode layer 2, and are respectively and electrically connected to the wiring portions 211, 232 of the electrode layer 2 by wiring. At least three side surfaces 42 of each of the LED chips 4 are flush with at least three edges of the corresponding bonding portion 221, 231.

The Zener chips 5 are respectively mounted on the bonding portions 221, 231 of the electrode layer 2, and are respectively and electrically connected to the wiring portions 211, 232 of the electrode layer 2 by wiring. The LED chip 4 and the Zener chip 5, which are mounted on the same bonding portion 211, 231, are arranged on two different locations, thereby preventing a bonding adhesive from overflowing.

It should be noted that the number of the LED chips 4, the number of the phosphor sheets 6a, and the number of the first translucent layers 7a in the present embodiment are the same. The structure of each LED chip 4, the corresponding phosphor sheet 6a, and the corresponding first translucent layer 7a is substantially identical to the structure of the other LED chip 4, the corresponding phosphor sheet 6a, and the corresponding first translucent layer 7a.

As shown in FIGS. 2, 5, and 6, the phosphor sheet 6a in the present embodiment can be a phosphor-in-glass (PiG) or a phosphor-in-ceramic (PiC). The refractive index of the phosphor sheet 6a is substantially within the range of 1.5 to 1.85. The phosphor sheet 6a has a width to thickness ratio of 5:1 to 15:1. A top surface 41 of the LED chip 4 is substantially covered by the phosphor sheet 6a, and at least one side surface 62a of the phosphor 6a protrudes from the LED chip 4 for a distance D1 of 5 µm~10 µm.

Specifically, the phosphor sheet 6a in the present embodiment has at least three side surfaces 62a, which respectively protrude from the three side surfaces 42 of the LED chip 4 flush with the outer edge of the corresponding bonding portion 221, 231. The LED package structure 100 in the present embodiment preferably includes a transparent adhesive layer G for adhering the phosphor sheet 6a to the LED chip 4.

The phosphor sheet 6a has a light emitting surface 61a arranged away from the LED chip 4. The light emitting surface 61a has a central region 611a and a ring-shaped region 612a surrounding the central region 611a. The ring-shaped region 612a in the present embodiment is arranged between the central region 611a and an edge of the light emitting surface 61a. The shape of the central region 611a can be changed according to practical needs, such as circular, square, or rectangular.

The first translucent layer 7a has a refractive index, which is larger than one and is smaller than the refractive index of the phosphor sheet 6a. The first translucent layer 7a in the present embodiment can be made of silicone resin, epoxy resin, polyurethanes, or other optical material (e.g., silicon dioxide or magnesium fluoride).

Specifically, the first translucent layer 7a is in an enclosed ring shape and covers entirely the ring-shaped region 612a of the phosphor sheet 6a. The first translucent layer 7a has a thickness D2 of 50 µm to 100 µm. The central region 611a has a width W2, which is smaller than or equal to 10 times the thickness D2 of the first translucent layer 7a, and the width W2 is preferably larger than 200 µm and smaller than 500 µm.

Moreover, a width W1 of the light emitting surface 61a is substantially 2~6 times of the width W2 of the central region 611a. According to a simulation result, when the width W1 is 5 times of the width W2, the luminous flux of the LED package structure 100 can be increased about 16.67%, and when the width W1 is 3 times of the width W2, the luminous flux of the LED package structure 100 can be increased about 9.67%.

In the present embodiment, the LED package structure 100 adapts the first translucent layer 7a, which has the refractive index larger than one and smaller than the refractive index of the phosphor sheet 6a, to be disposed on the ring-shaped region 612a of the phosphor sheet 6a, so that the total reflection occurred on the ring-shaped region 612a can be reduced, thereby effectively improving the yellow ring problem by using the LED package structure 100 of the present disclosure.

The reflective housing 9 is disposed on the electrode layer 2 and the insulating layer 8. The reflective housing 9 and the insulating layer 8 in the present embodiment are integrally formed as one piece, but the present disclosure is not limited thereto. The reflective housing 9 surrounds and covers the side surfaces 42 of each LED chip 4 and the side surfaces 62a of each phosphor sheet 6a, and the Zener chips 5 are embedded in the reflective housing 9, thereby preventing the Zener chips 5 from blocking light generated from the LED chips 4. The reflective housing 9 has a top surface 91 substantially flush with the light emitting surface 61a of each phosphor sheet 6a. That is to say, a distance between the top surface 91 of the reflective housing 9 and the substrate 1 is equal to a distance between the light emitting surface 61a of each phosphor 6a and the substrate 1.

Moreover, a portion of the reflective housing 9 having an inverted T-shaped cross-section is defined as a spacer 92. The spacer 92 is configured to separate two adjacent LED chips 4 and is configured to separate two adjacent phosphor sheets 6a, which are respectively disposed on the two adjacent LED chips 4. A portion of the spacer 92 arranged adjacent to the insulating layer 8 has a width W3, which is larger than a width W4 of a portion of the spacer 92 arranged away from the insulating layer 8.

In addition, the LED package structure 100 in the present embodiment is shown as FIGS. 1 to 6, but it is not limited thereto. In other words, the LED package structure 100 can be changed according to practical needs.

Figure 7:
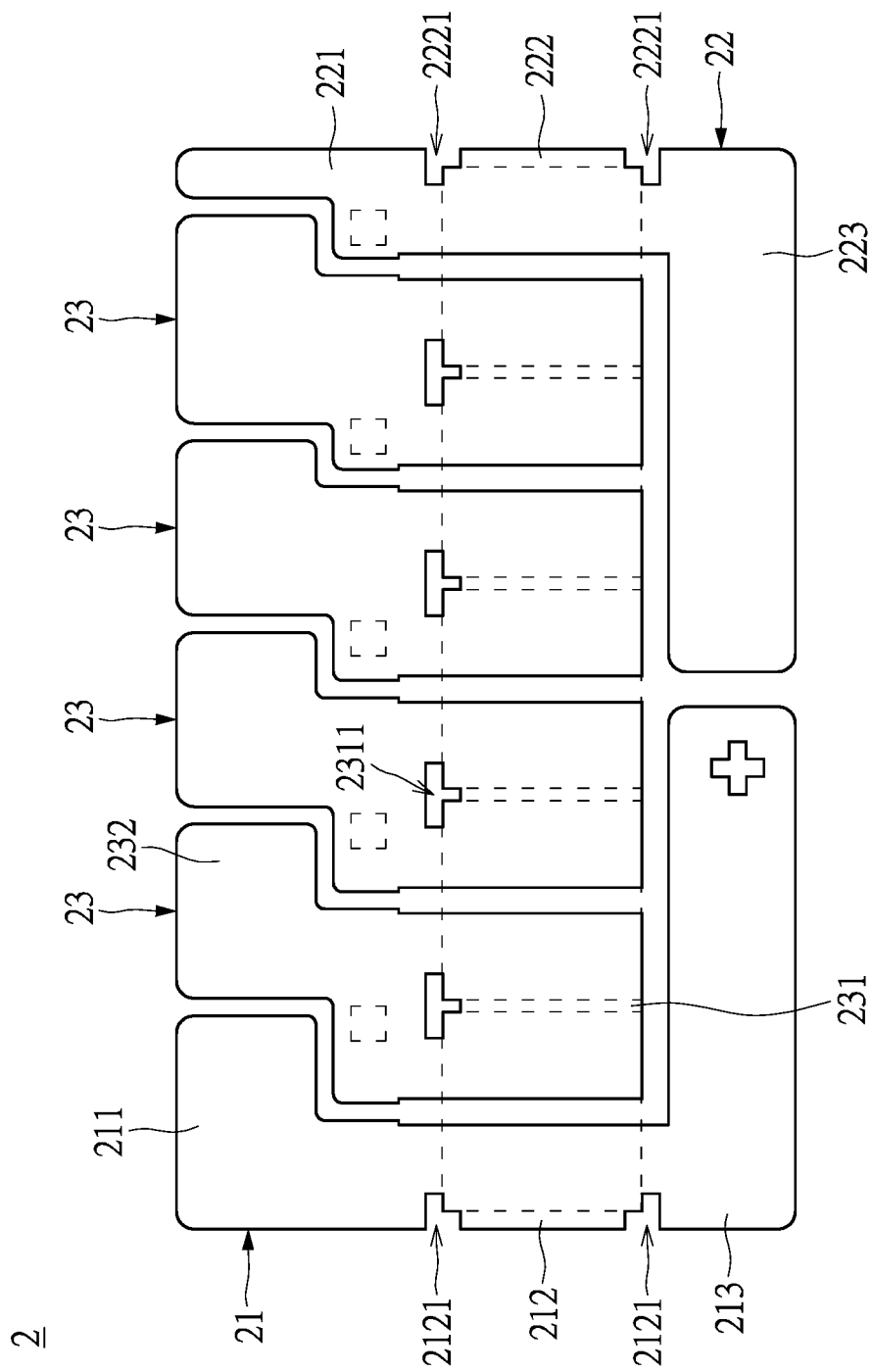
FIG. 7 is a planar view showing the electrode layer of the LED package structure in another configuration according to the first embodiment.

For example, the LED chip 4 of the LED package structure 100 can be a flip chip, and the structure of the electrode layer 2 is adjusted to cooperate with the flip chip (as shown in FIG. 7). Specifically, the electrode layer 2 includes a first metallic pad 21, a second metallic pad 22, and four third metallic pads 23 arranged between the first metallic pad 21 and the second metallic pad 22. The first metallic pad 21 has an L-shaped functional portion 211, a rectangular first extending portion 212, and a rectangular first electrode portion 213. The second metallic pad 22 has an L-shaped functional portion 221, a rectangular second extending portion 222, and a rectangular second electrode portion 223. The two functional portions 211, 221 are provided for bonding or wiring. Each of the first extending portion 212 and the second extending portion 222 has two L-shaped slots 2121, 2221. The third metallic pads 23 each has a substantial S-shape, and the third metallic pads 23 are spaced apart from each other. An upper portion of each third metallic pad 23 is defined as a wiring portion 232 for wiring one of the Zener chips 5, and a lower portion of each third metallic pad 23 is defined as a bonding portion 231 for mounting one of the LED chips 4 and one of the Zener chips 5. The lower portion of each third metallic pad 23 further has a T-shaped slot 2311. It should be noted that each of the LED chips 4 in the present embodiment is disposed on and across two adjacent metallic pads 21, 22, 23. Specifically, the first LED chip 4 counted from the left side of FIG. 7 is disposed on the first metallic pad 21 and the adjacent third metallic pad 23. Each of the second, third, and fourth LED chips 4 is disposed on any two adjacent third metallic pads 23. The fifth LED chip 4 is disposed on the second metallic pad 22 and the adjacent third metallic pad 23. The L-shaped slots 2121, 2221 and the T-shaped slots 2311 are provided for positioning the LED chips 4.

Second Embodiment

Figure 8:
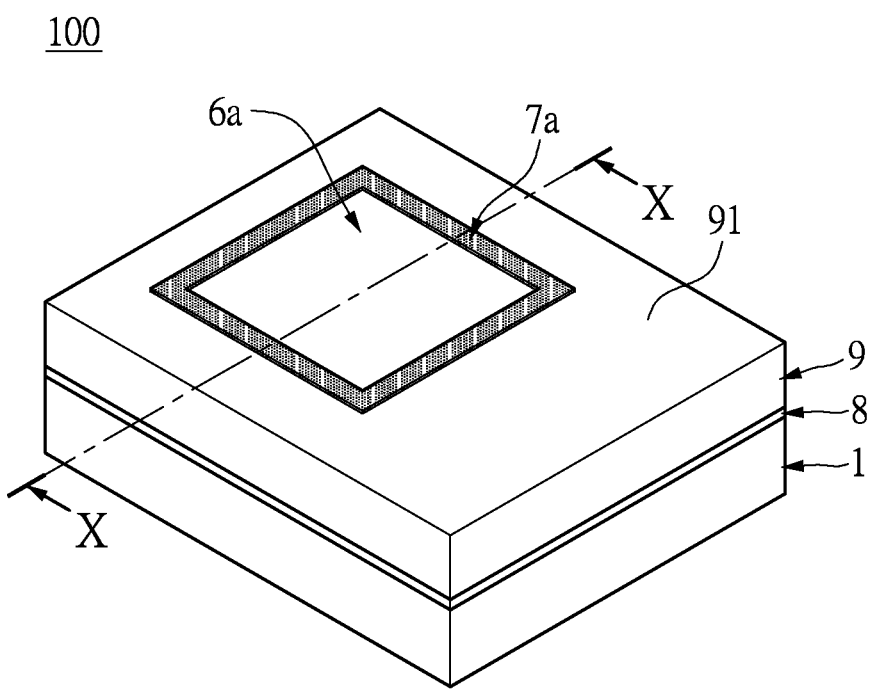
FIG. 8 is a perspective view showing the LED package structure according to a second embodiment of the present disclosure.
Figure 9:
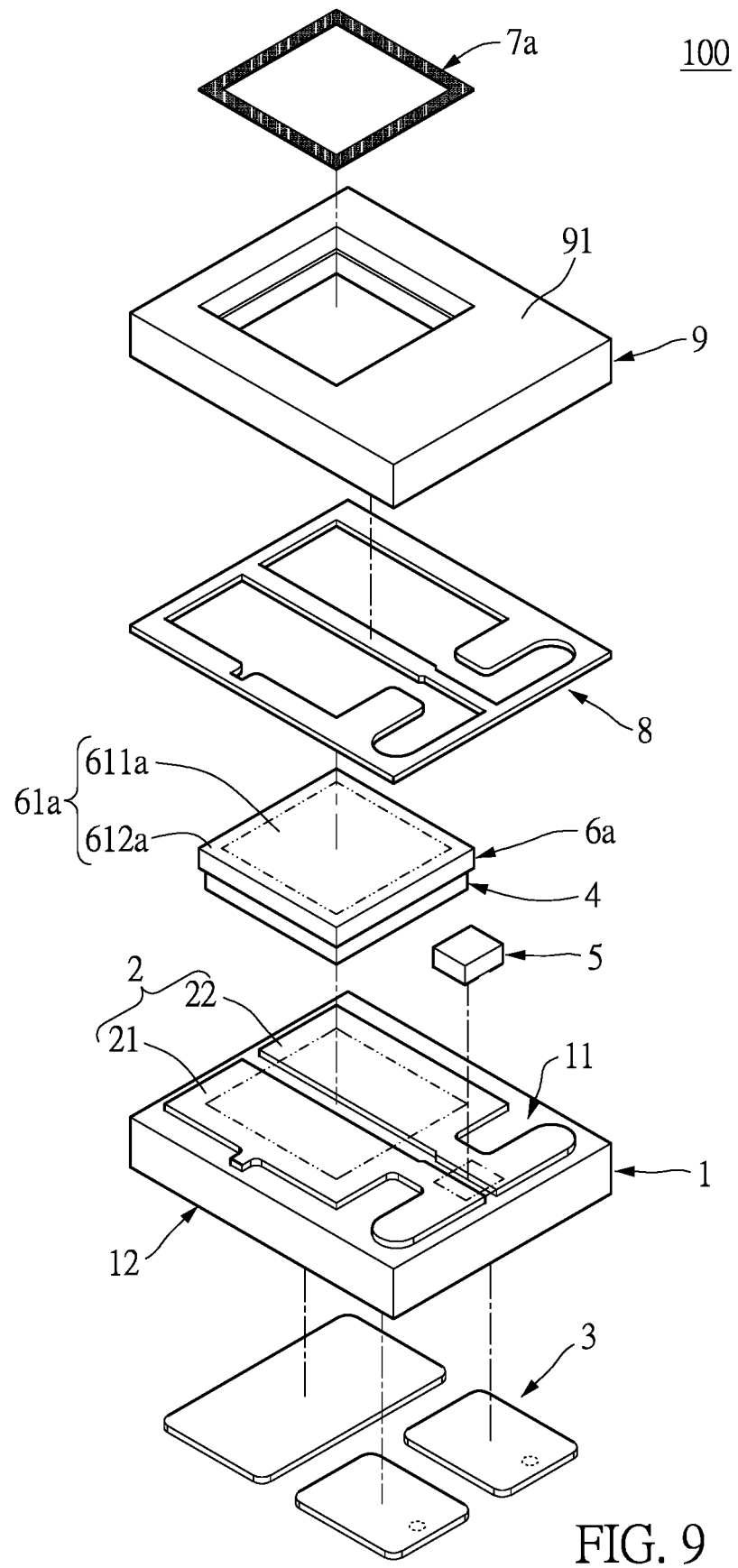
FIG. 9 is an exploded view of FIG. 8.
Figure 10:
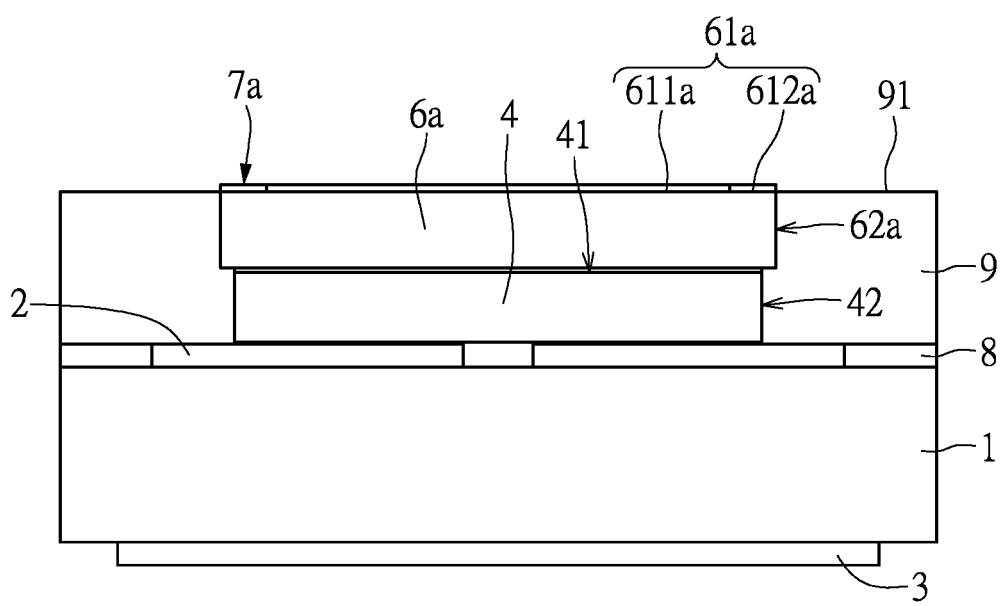
FIG. 10 is a cross-sectional view taken along a cross-sectional line X-X of FIG. 8.

Reference is made to FIGS. 8 to 10, which illustrate a second embodiment of the present disclosure. The difference between the second embodiment and the first embodiment is disclosed as follows. The number of the LED chips 4 of the LED package structure 100 in the second embodiment is only one, and other components of the LED package structure 100 can be adjusted according to the number of the LED chips 4.

Specifically, The LED package structure 100 includes a substrate 1, an electrode layer 2, an insulating layer 8, a soldering layer 3, an LED chip 4, a Zener chip 5, a phosphor sheet 6a, a ring-shaped first translucent layer 7a, and a reflective housing 9. The electrode layer 2 and the insulating layer 8 are disposed on one surface of the substrate 1, and the soldering layer 3 is disposed on the other surface of the substrate 1. The LED chip 4 and the Zener chip 5 are mounted on the electrode layer 2 and the insulating layer 8. The phosphor sheet 6a covers the LED chip 4. The first translucent layer 7a is disposed on the phosphor sheet 6a. The reflective housing 9 is disposed on the electrode layer 2 and the insulating layer 8, and the reflective housing 9 covers the side surfaces 42 of the LED chip 4 and the sides of the phosphor sheet 6a.

The substrate 1 has a first surface 11 and a second surface 12 opposite to the first surface 11. The substrate 1 includes a plurality of conductive pillars (not labeled) embedded therein, and two opposite ends of each conductive pillar are respectively exposed from the first surface 11 and the second surface 12.

The electrode layer 2 is disposed on the first surface 11 of the substrate 1. The electrode layer 2 includes a first metallic pad 21 and a second metallic pad 22 that is separated from the first metallic pad 21. The insulating layer 8 is disposed on the first surface 11 of the substrate 1. The insulating layer 8 is shape-complementary to and coplanar with the electrode layer 2. That is to say, the insulating layer 8 is disposed on a portion of the first surface 11 of the substrate 1 which is not connected to the electrode layer 2, and a side edge of the insulating layer 8 is flush with a side edge of the substrate 1. The soldering layer 3 is disposed on the second surface 12 and is electrically connected to the electrode layer 2 and the LED chip 4 by using the conductive pillars.

The LED chip 4 and the Zener chip 5 are mounted on the electrode layer 2 and the insulating layer 8. The phosphor sheet 6a and the first translucent layer 7a in the present embodiment are substantially identical to the first embodiment. The top surface 41 of the LED chip 4 is covered entirely by the phosphor sheet 6a. The first translucent layer 7a is in an enclosed ring shape, and the ring-shaped region 612a of the light emitting surface 61a of the phosphor sheet 6a is covered entirely by the first translucent layer 7a.

The reflective housing 9 is disposed on the electrode layer 2 and the insulating layer 8. The reflective housing 9 and the insulating layer 8 in the present embodiment are integrally formed as one piece, but the present disclosure is not limited thereto. The reflective housing 9 surrounds and covers the sides of each LED chip 4 and the sides of each phosphor sheet 6a, and the Zener chips 5 are embedded in the reflective housing 9. The reflective housing 9 has a top surface 91 substantially flush with the light emitting surface 61a of the phosphor sheet 6a. That is to say, a distance between the top surface 91 of the reflective housing 9 and the substrate 1 is equal to a distance between the light emitting surface 61a of the phosphor 6a and the substrate 1.

Third Embodiment

Figure 11:
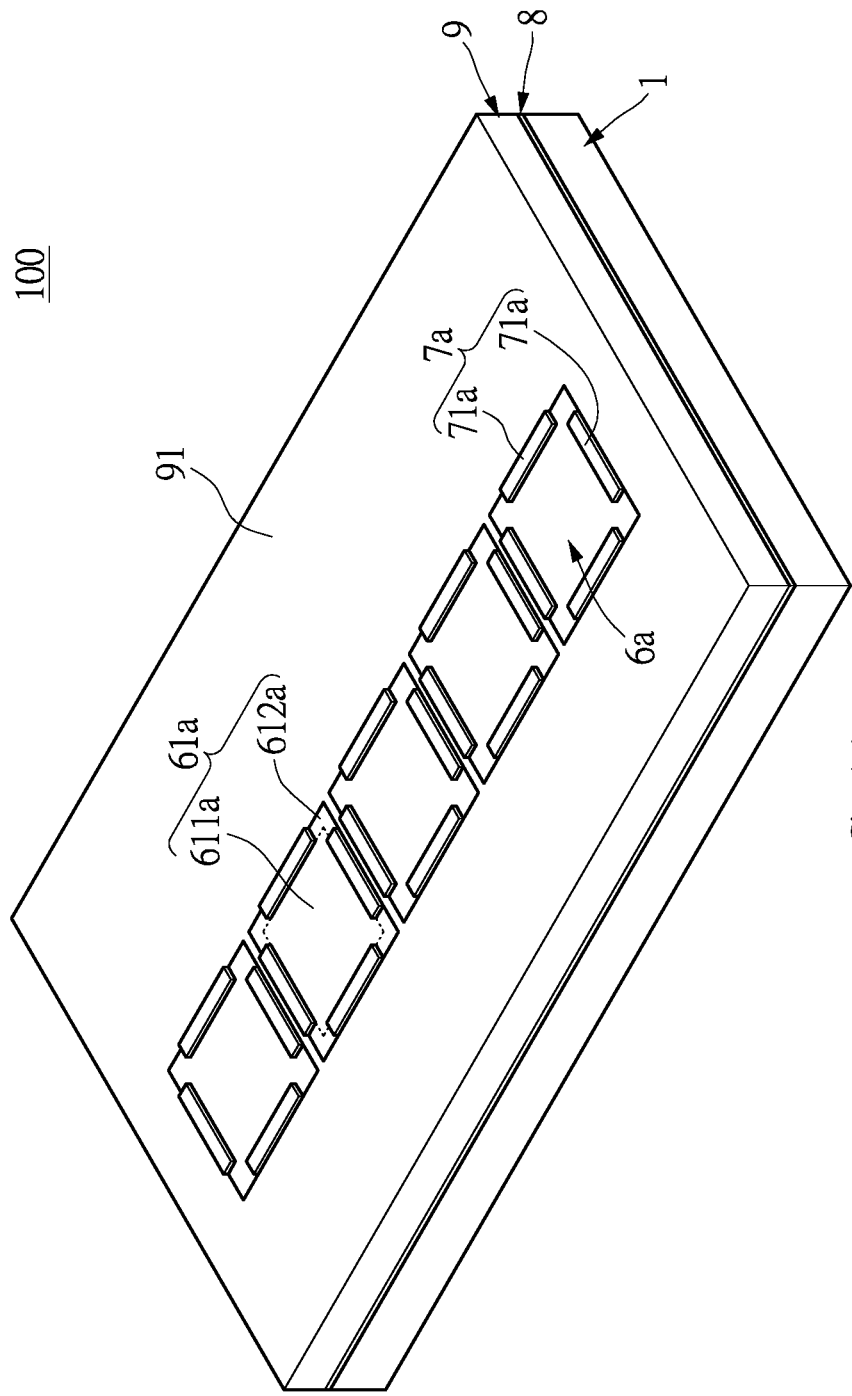
FIG. 11 is a perspective view showing the LED package structure according to a third embodiment of the present disclosure.
Figure 12:
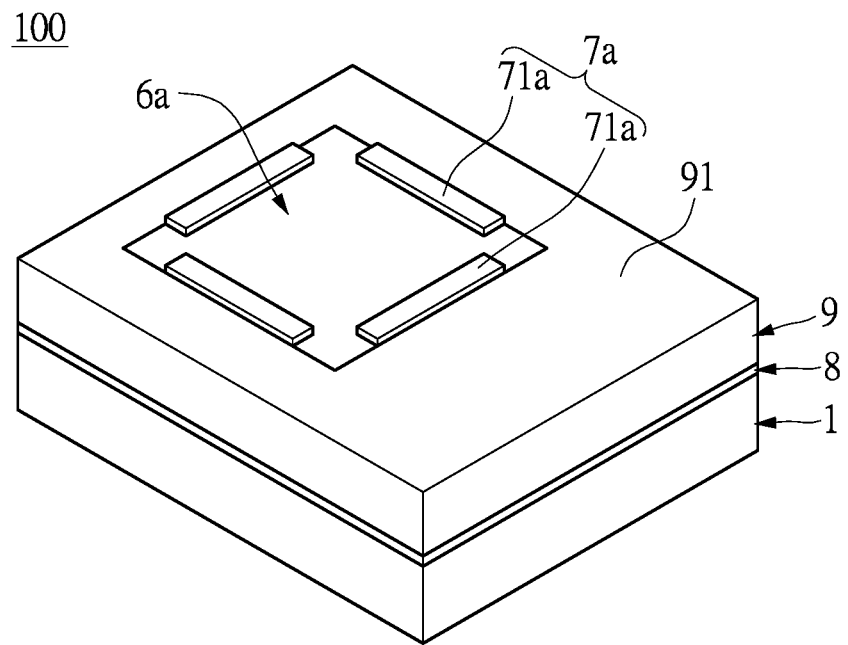
FIG. 12 is a perspective view showing the LED package structure in another configuration according to the third embodiment.

Reference is made to FIGS. 11 and 12, which illustrate a third embodiment of the present disclosure. The third embodiment is similar to the above first and second embodiments, and the difference between the third embodiment and the above two embodiments is disclosed as follows. The first translucent layer 7a in the present embodiment includes a plurality of translucent segments 71a separately disposed on the ring-shaped region 612a of the phosphor sheet 6a. Specifically, the translucent segments 71a of each translucent layer 7a cover at least 60% of an area of the ring-shaped region 612a of the corresponding phosphor sheet 6a, and do not cover the central region 611a of the corresponding phosphor sheet 6a.

Moreover, the number of the LED chips 4 of the LED package structure 100 in the present embodiment can be more than one (as shown in FIG. 11) or only one (as shown in FIG. 12), and other components of the LED package structure 100 can be adjusted according to the number of the LED chips 4.

Fourth Embodiment

Figure 13:
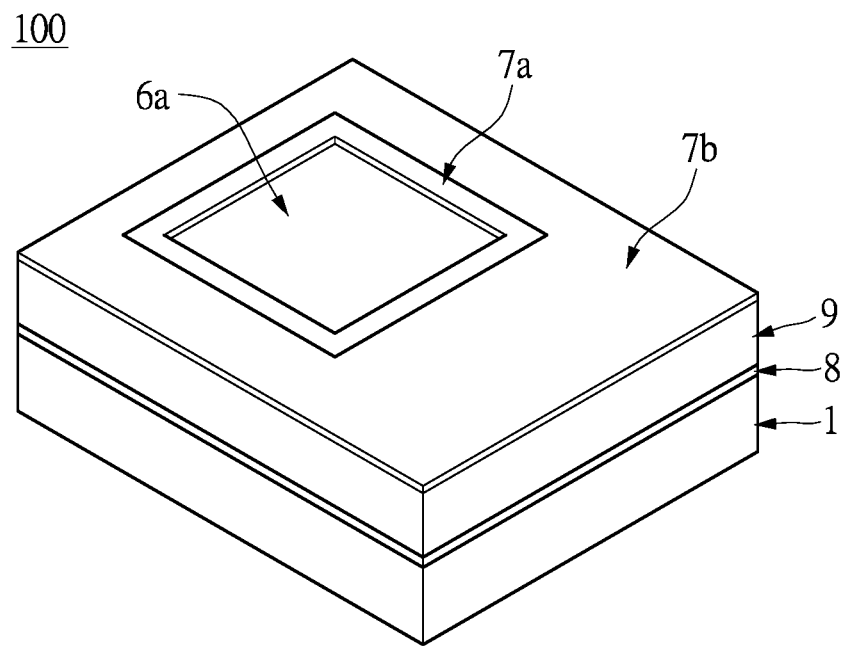
FIG. 13 is a perspective view showing the LED package structure according to a fourth embodiment of the present disclosure.

Reference is made to FIG. 13, which illustrates a fourth embodiment of the present disclosure. The fourth embodiment is similar to the second embodiment, and the difference between the fourth embodiment and the second embodiment is disclosed as follows. The LED package structure 100 in the present embodiment further includes a second translucent layer 7b surrounding and being coplanar with the first translucent layer 7a. The second translucent layer 7b is disposed on at least part of the top surface 91 of the reflective housing 9. The first translucent layer 7a and the second translucent layer 7b are cooperated to form an opening, and the central region 611a of the light emitting surface 61a of the at least one phosphor sheet 6a is exposed from the opening. Specifically, the second translucent layer 7b can be disposed on the entire top surface 91 of the reflective housing 9 (as shown in FIG. 13) or part of the top surface 91 of the reflective housing 9 (not shown).

Fifth Embodiment

Figure 14:
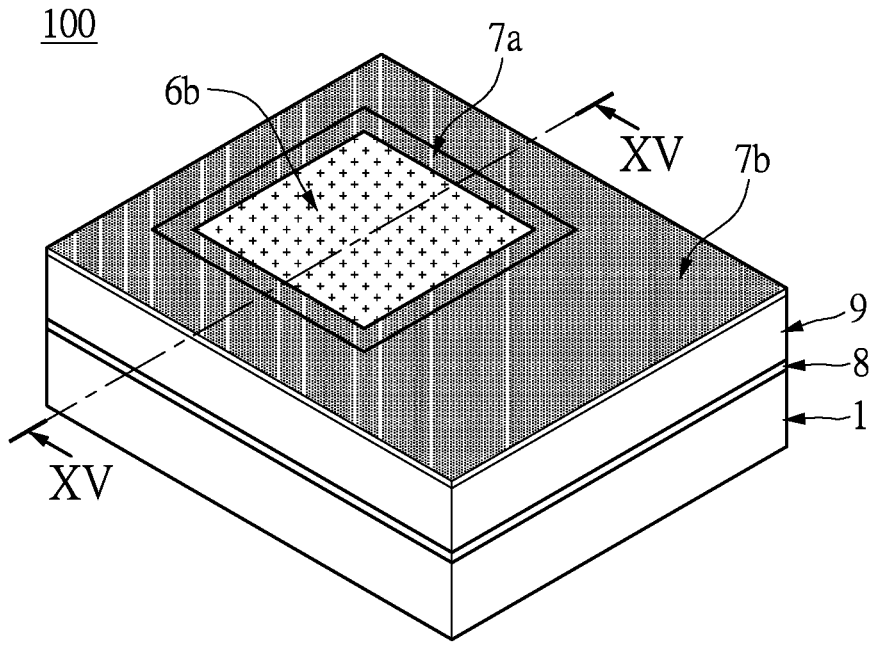
FIG. 14 is a perspective view showing the LED package structure according to a fifth embodiment of the present disclosure.
Figure 15:
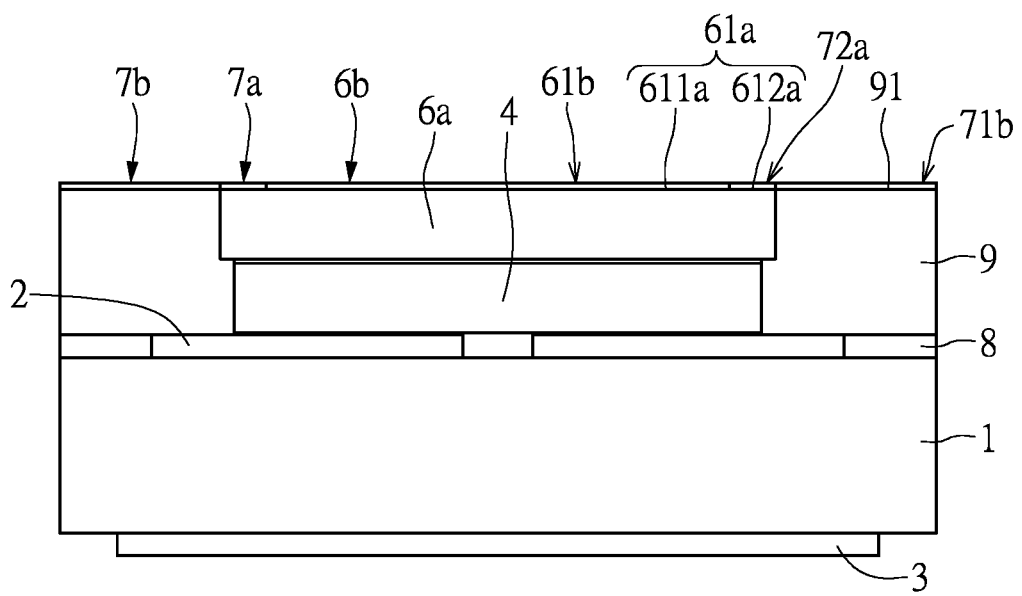
FIG. 15 is a cross-sectional view taken along a cross-sectional line XV-XV of FIG. 14.
Figure 16:
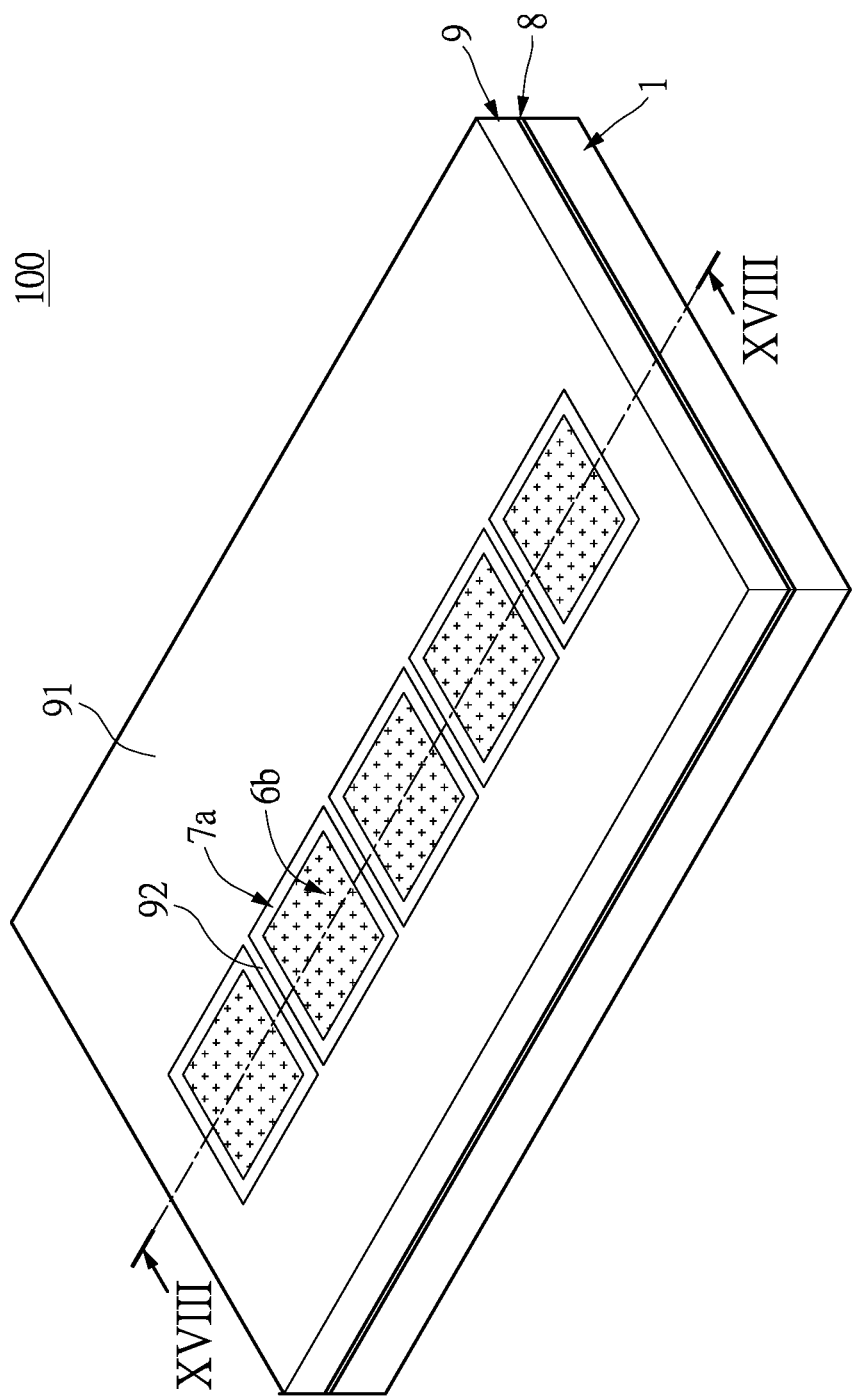
FIG. 16 is a perspective view showing the LED package structure according to a sixth embodiment of the present disclosure.
Figure 17:
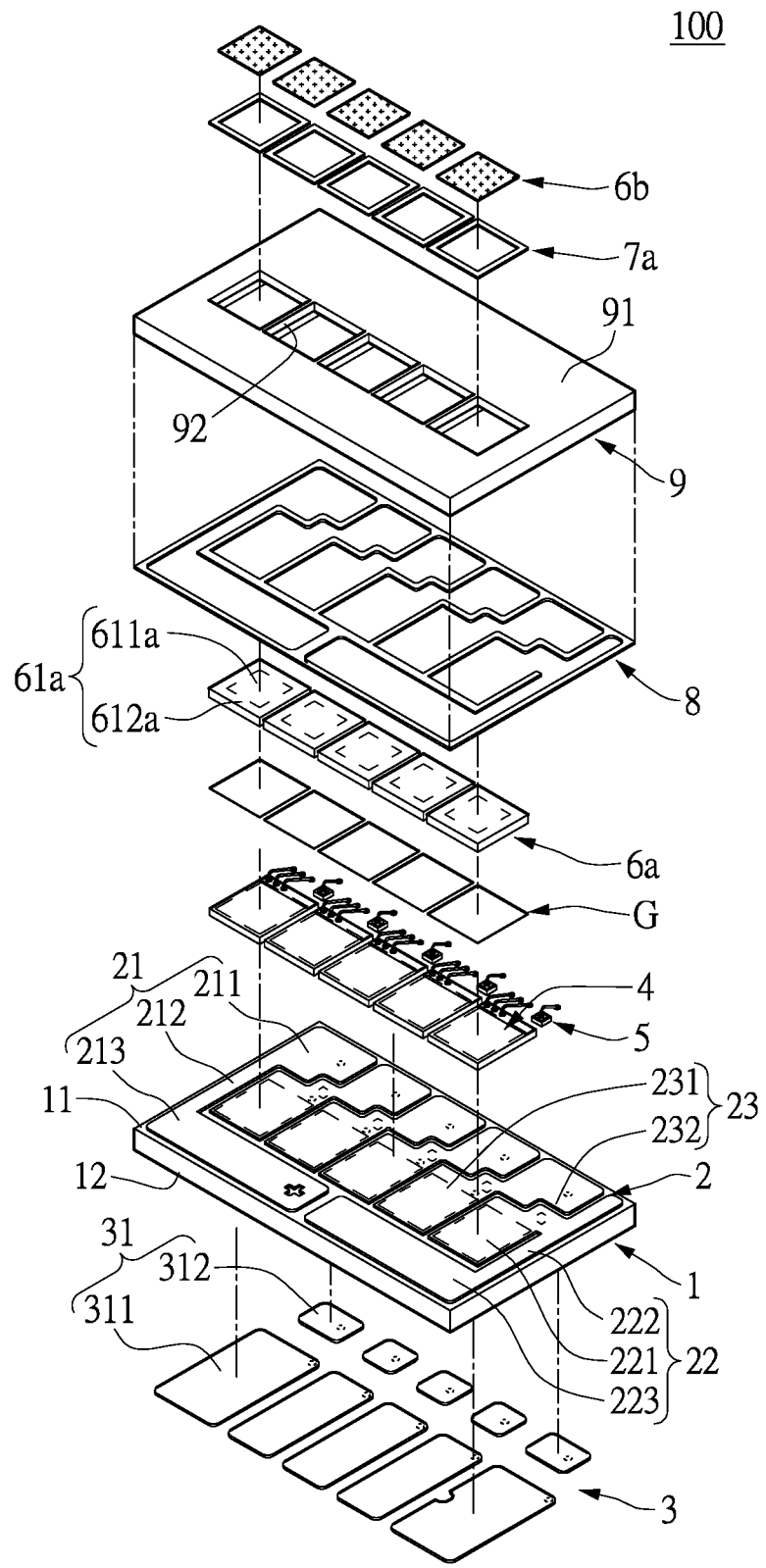
FIG. 17 is an exploded view of FIG. 16.
Figure 18:
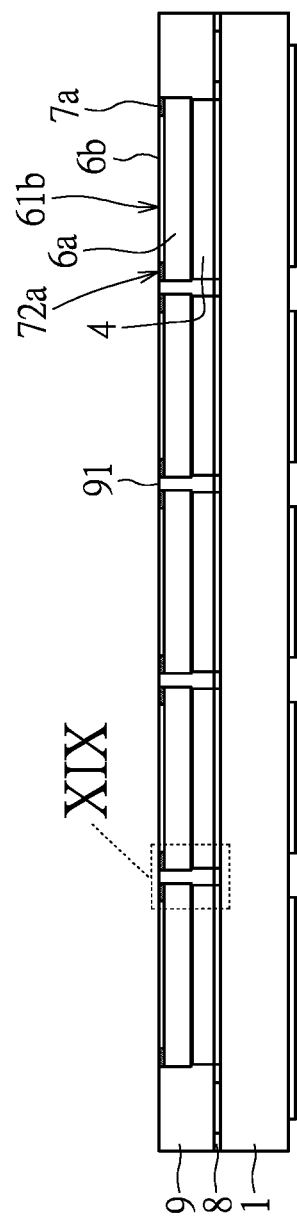
FIG. 18 is a cross-sectional view taken along a cross-sectional line XVIII-XVIII of FIG. 16.
Figure 19:
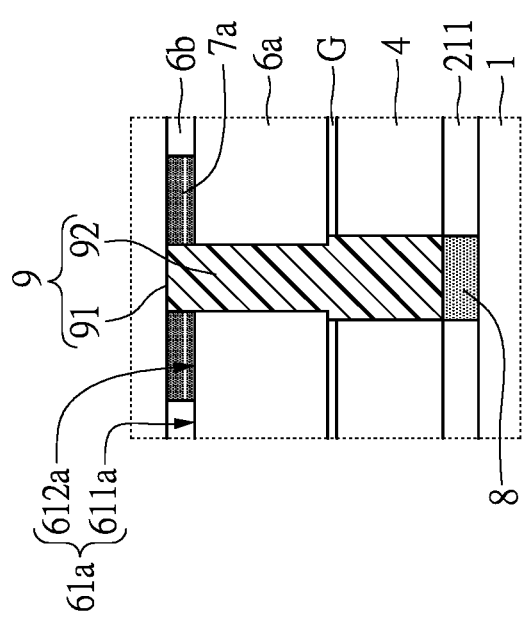
FIG. 19 is an enlarged view showing a portion XIX of FIG. 18.

Reference is made to FIGS. 14 and 15, which illustrate a fifth embodiment of the present disclosure. The fifth embodiment is similar to the fourth embodiment, and the difference between the fifth embodiment and the fourth embodiment is disclosed as follows. The LED package structure 100 in the present embodiment further includes an auxiliary phosphor sheet 6b disposed on the central region 611a of the phosphor sheet 6a. The auxiliary phosphor sheet 6b is received in a space defined by the first translucent layer 7a (or the opening defined by the first translucent layer 7a and the second translucent layer 7b), and a top surface 61b of the auxiliary phosphor sheet 6b is substantially flush with the top surface 72a of the first translucent layer 7a and the top surface 71b of the second translucent layer 7b.

Sixth Embodiment

Reference is made to FIGS. 16 to 19, which illustrate a sixth embodiment of the present disclosure. The sixth embodiment is similar to the first embodiment, and the differences between the sixth embodiment and the first embodiment are disclosed as follows.

The LED package structure 100 in the present embodiment includes a substrate 1, an electrode layer 2, an insulating layer 8, a soldering layer 3, a plurality of LED chips 4, a plurality of Zener chips 5, a plurality of phosphor sheets 6a, a plurality of auxiliary phosphor sheets 6b, a plurality of first translucent layers 7a each having a ring shape, and a reflective housing 9. The electrode layer 2 and the insulating layer 8 are disposed on one surface of the substrate 1, and the soldering layer 3 is disposed on the other surface of the substrate 1. The LED chips 4 and the Zener chips 5 are mounted on the electrode layer 2 and the insulating layer 8. The phosphor sheets 6a respectively cover the LED chips 4. The auxiliary phosphor sheets 6b are respectively disposed on the phosphor sheets 6a. The first translucent layers 7a are respectively disposed on the phosphor sheets 6a. The reflective housing 9 is disposed on the electrode layer 2 and the insulating layer 8, and the reflective housing 9 covers the side surfaces 42 of each LED chip 4, the side surfaces 62a of each phosphor sheet 6a, and the sides of each first translucent layer 7a.

In the present embodiment, the number of the LED chips 4, the number of the phosphor sheets 6a, the number of the auxiliary phosphor sheets 6b, and the number of the first translucent layers 7a are the same. The material of the auxiliary phosphor sheet 6b is identical to that of the phosphor sheet 6a. Each of the auxiliary phosphor sheets 6b is disposed on the central region 611a of the corresponding phosphor sheet 6a and is received in a space defined by the corresponding first translucent layer 7a. Moreover, the top surface 91 of the reflective housing 9 is substantially flush with the top surface 61b of each auxiliary phosphor sheet 6b and the top surface 72a of each first translucent layer 7a.

In addition, the LED package structure 100 of the present embodiment can be adjusted according to the above first to fifth embodiments.

Seventh Embodiment

Figure 20:
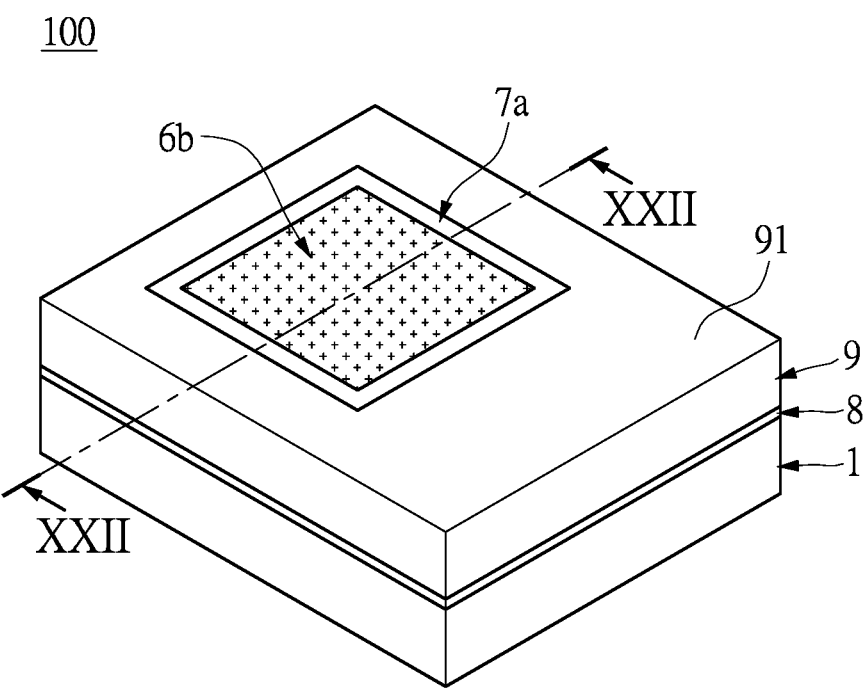
FIG. 20 is a perspective view showing the LED package structure according to a seventh embodiment of the present disclosure.
Figure 21:
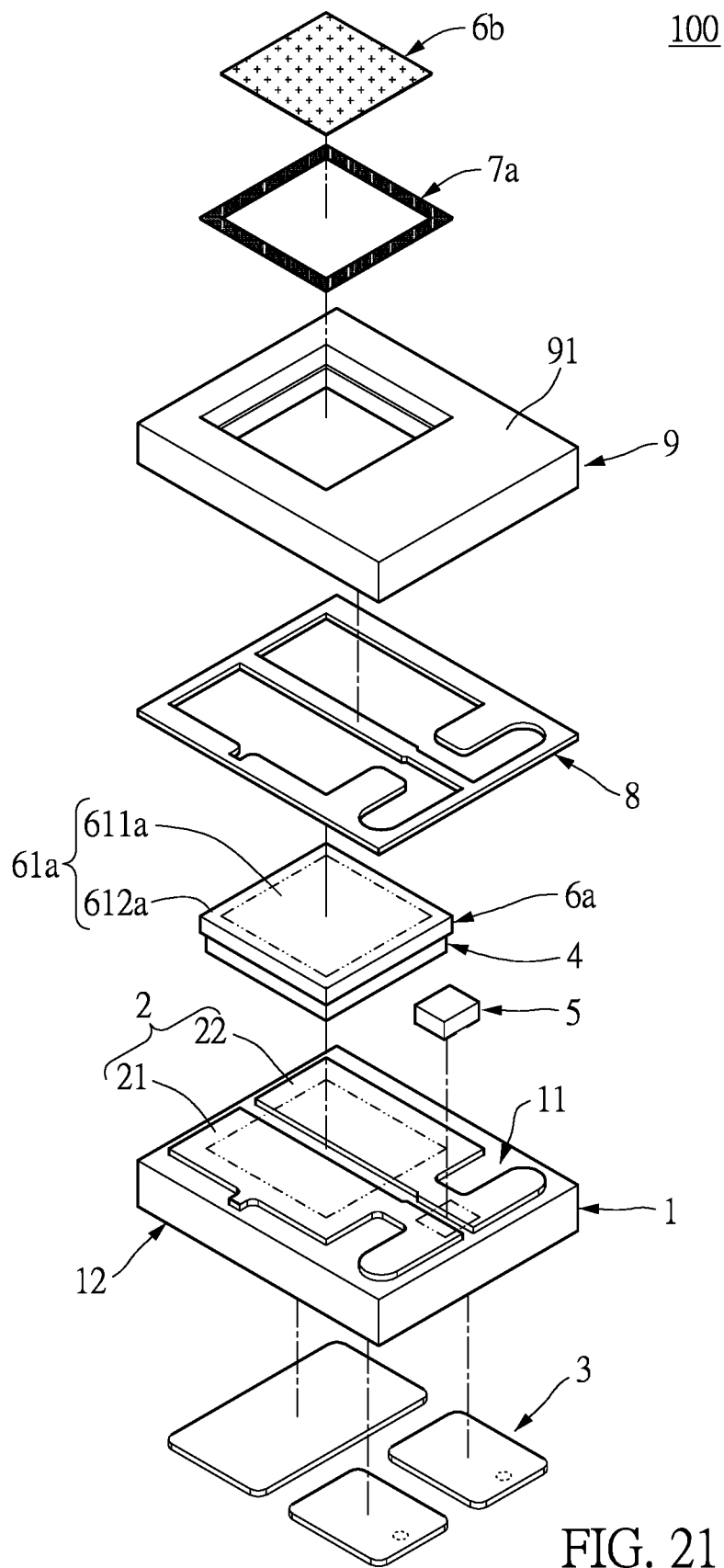
FIG. 21 is an exploded view of FIG. 20.
Figure 22:
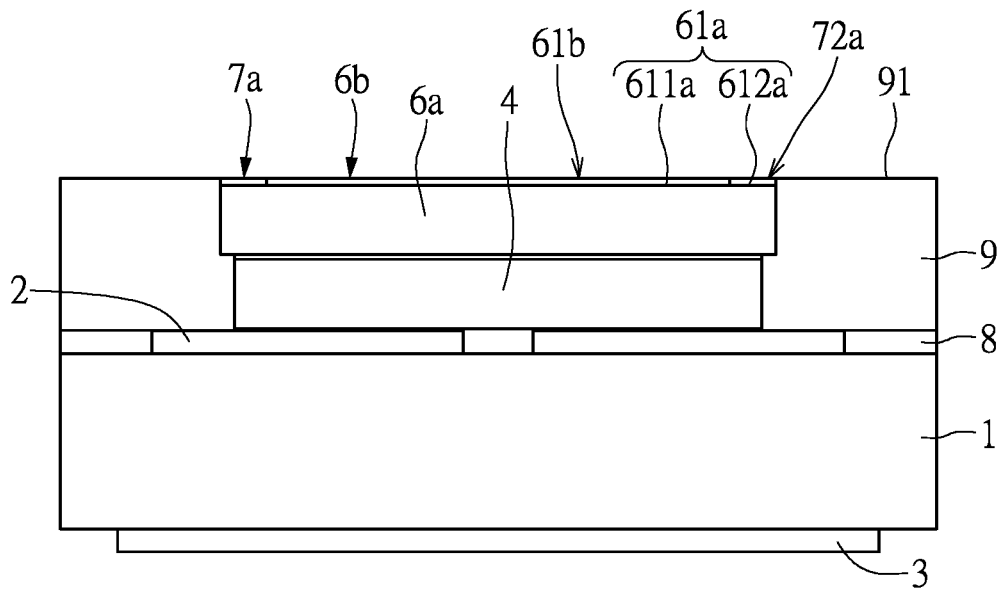
FIG. 22 is a cross-sectional view taken along a cross-sectional line XXII-XXII of FIG. 20.

Reference is made to FIGS. 20 to 22, which illustrate a seventh embodiment of the present disclosure. The seventh embodiment is similar to the above second and sixth embodiment, and the differences between the seventh embodiment and the above second and sixth embodiments are disclosed as follows. The number of the LED chips 4 of the LED package structure 100 in the present embodiment can be only one. The auxiliary phosphor sheet 6b is received in a space defined by the first translucent layer 7a. The top surface 91 of the reflective housing 9 is substantially flush with the top surface 61b of the auxiliary phosphor sheet 6b and the top surface 72a of the first translucent layer 7a. Moreover, other components of the LED package structure 100 can be adjusted according to the number of the LED chips 4, such as the adjustment set forth in the second embodiment.

Eighth Embodiment

Figure 23:
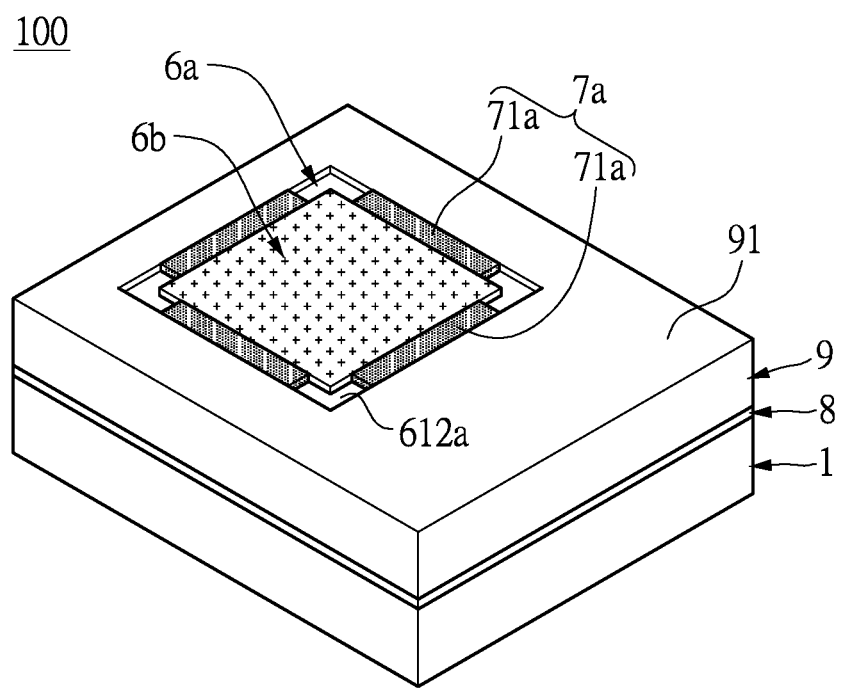
FIG. 23 is a perspective view showing the LED package structure according to an eighth embodiment of the present disclosure.
Figure 24:
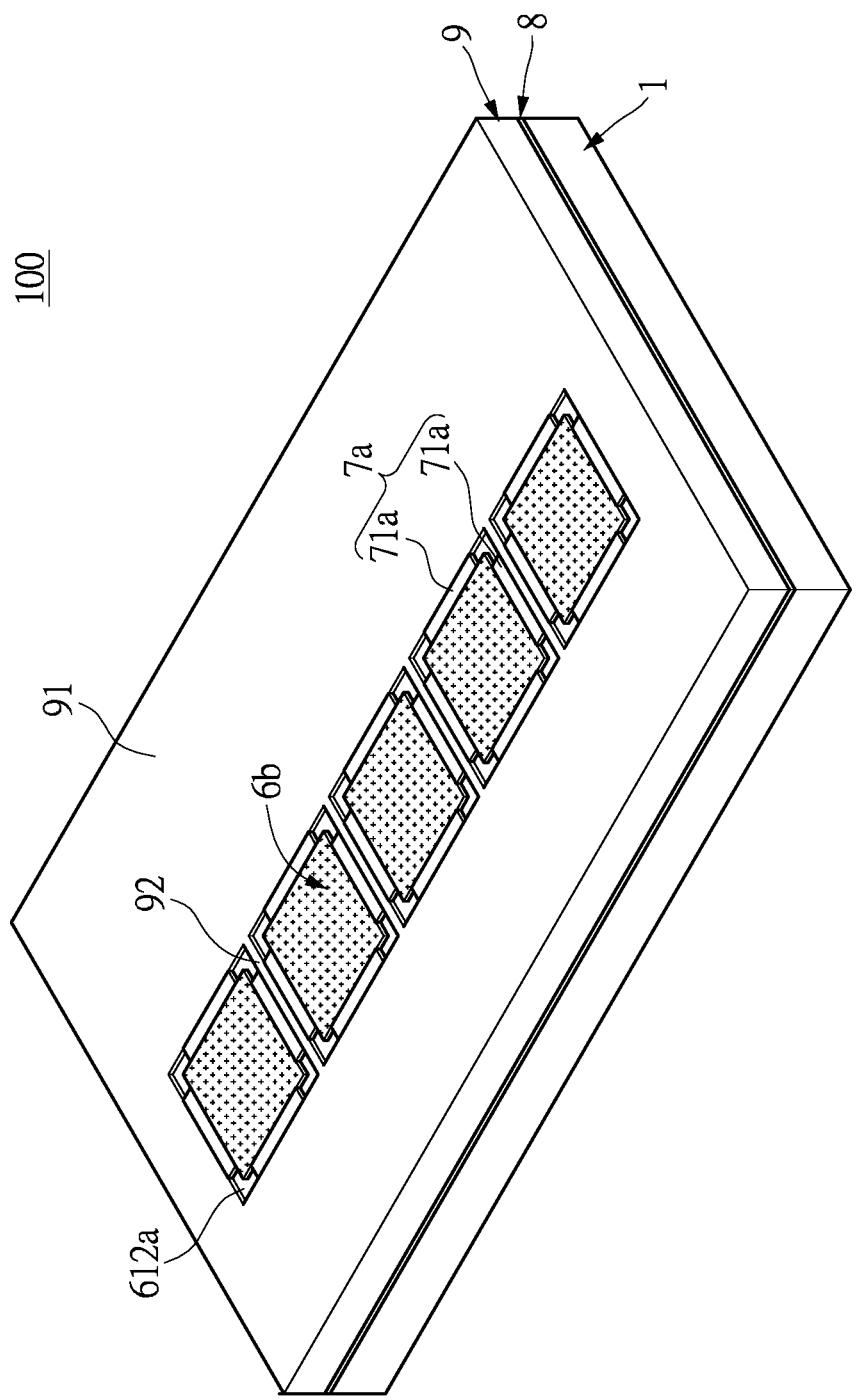
FIG. 24 is a perspective view showing the LED package structure in another configuration according to the eighth embodiment.

Reference is made to FIGS. 23 and 24, which illustrate an eighth embodiment of the present disclosure. The eighth embodiment is similar to the seventh embodiment, and the difference between the eighth embodiment and the above seventh embodiment is disclosed as follows. Each first translucent layer 7a in the present embodiment includes a plurality of translucent segments 71a separately disposed on the ring-shaped region 612a of the corresponding phosphor sheet 6a. Specifically, the translucent segments 71a of each translucent layer 7a cover at least 60% of an area of the ring-shaped region 612a of the corresponding phosphor sheet 6a.

Moreover, the number of the LED chips 4 of the LED package structure 100 in the eighth embodiment can be more than one (as shown in FIG. 24) or only one (as shown in FIG. 23), and other components of the LED package structure 100 can be adjusted according to the number of the LED chips 4.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An LED package structure, comprising:
a substrate having a first surface and a second surface opposite to the first surface;
an electrode layer disposed on the first surface of the substrate;
an insulating layer disposed on the first surface of the substrate, wherein the insulating layer is shape-complementary to and coplanar with the electrode layer;
at least one LED chip mounted on the electrode layer and the insulating layer;
at least one phosphor sheet covering entirely a top surface of the at least one LED chip, wherein the at least one phosphor sheet has a light emitting surface arranged away from the at least one LED chip, and the light emitting surface of the at least one phosphor sheet has a central region and a ring-shaped region surrounding the central region;
at least one first translucent layer directly contacting the at least one phosphor sheet only at the ring-shaped region and covering at least 60% of an area of the ring-shaped region of the at least one phosphor sheet, the central region being not covered directly above by the at least one first translucent layer, wherein a refractive index of the at least one first translucent layer is larger than one and is smaller than a refractive index of the at least one phosphor sheet;

a reflective housing disposed on the electrode layer and the insulating layer and covering side surfaces of the at least one LED chip and side surfaces of the at least one phosphor sheet, wherein a top surface of the reflective housing is substantially flush with the light emitting surface of the at least one phosphor sheet, and wherein the reflective housing defines an accommodating space for accommodating the at least one LED chip and the at least one phosphor sheet; and a soldering layer disposed on the second surface of the substrate and electrically connected to the electrode layer and the at least one LED chip, wherein in a plan view an outer periphery of the at least one first translucent layer is not larger than an opening of the accommodating space of the reflective housing.

2. The LED package structure as claimed in claim 1, wherein the at least one first translucent layer includes a plurality of translucent segments separately disposed on the ring-shaped region of the at least one phosphor sheet.

3. The LED package structure as claimed in claim 1, wherein the at least one first translucent layer is in a ring shape and covers entirely the ring-shaped region of the at least one phosphor sheet.

4. The LED package structure as claimed in claim 1, further comprising a second translucent layer surrounding the at least one first translucent layer and being coplanar with the at least one first translucent layer, wherein the at least one first translucent layer and the second translucent layer are cooperated to form an opening, and the central region of the light emitting surface of the at least one phosphor sheet is exposed from the opening.

5. The LED package structure as claimed in claim 4, further comprising at least one auxiliary phosphor sheet disposed on the central region of the at least one phosphor sheet, wherein the at least one auxiliary phosphor sheet is arranged in the opening defined by the at least one first translucent layer and the second translucent layer, and a top surface of the at least one auxiliary phosphor sheet is substantially flush with a top surface of the at least one first translucent layer.

6. The LED package structure as claimed in claim 1, wherein the at least one LED chip's number, the at least one phosphor sheet's number, and the at least one first translucent layer's number are the same and more than one.

7. The LED package structure as claimed in claim 6, wherein each of the first translucent layers includes a plurality of translucent segments separately disposed on the ring-shaped region of the corresponding phosphor sheet.

8. The LED package structure as claimed in claim 6, wherein each of the first translucent layers is in a ring shape and covers entirely the ring-shaped region of the corresponding phosphor sheet.

9. The LED package structure as claimed in claim 1, wherein the at least one phosphor sheet has a width to thickness ratio within a range of 5:1 to 15:1.

10. The LED package structure as claimed in claim 1, wherein the refractive index of the at least one phosphor sheet is substantially within a range of 1.5 to 1.85.

11. The LED package structure as claimed in claim 1, wherein the at least one first translucent layer has a thickness of 50 μm to 100 μm, and the central region of the at least one phosphor sheet has a width smaller than or equal to 10 times the thickness of the at least one first translucent layer.

12. The LED package structure as claimed in claim 1, wherein the light emitting surface of the at least one phosphor sheet has a width substantially equal to 2-6 times a width of the central region.

* * * * *